(12) United States Patent
Ren et al.

(10) Patent No.: US 10,199,402 B2
(45) Date of Patent: Feb. 5, 2019

(54) DISPLAY DEVICE AND MANUFACTURING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Wenming Ren, Beijing (CN); Kai Wang, Beijing (CN); Yinhu Huang, Beijing (CN); Jong Won Moon, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 15 days.

(21) Appl. No.: 15/236,560

(22) Filed: Aug. 15, 2016

(65) Prior Publication Data

US 2017/0213856 A1 Jul. 27, 2017

(30) Foreign Application Priority Data

Jan. 27, 2016 (CN) .......................... 2016 1 0055690

(51) Int. Cl.
*H01L 27/12* (2006.01)
*G06F 3/044* (2006.01)
(Continued)

(52) U.S. Cl.
CPC ...... *H01L 27/1248* (2013.01); *G02F 1/13394* (2013.01); *G02F 1/133345* (2013.01);
(Continued)

(58) Field of Classification Search
CPC ............... H01L 27/1248; H01L 27/124; G02F 1/133345; G02F 1/133514; G02F 1/133516; G02F 1/13394; G02F 1/136286; G02F 2001/133354; G02F 2001/133398; G02F 2001/136295; G02F 2001/13396; G06F 3/0412; G06F 3/044; G06F 2203/01403; G06F 2203/04111
(Continued)

(56) References Cited

U.S. PATENT DOCUMENTS 10,018,877 B2 * 7/2018 Cho .................. G02F 1/13394
2001/0004280 A1 * 6/2001 Kim .................. G02F 1/136227
349/187

(Continued)

FOREIGN PATENT DOCUMENTS

CN 103913896 A 7/2014
CN 103926747 A 7/2014
(Continued)

OTHER PUBLICATIONS

The First Chinese Office Action dated Feb. 28, 2018; Appln. No. 201610055690.X.

*Primary Examiner* — Victoria K Hall
(74) *Attorney, Agent, or Firm* — Ladas & Parry LLP; Loren K. Thompson

(57) ABSTRACT

A display device and a manufacturing method thereof are provided, and the display device includes a color filter substrate and an array substrate which are cell-assembled, the array substrate includes a first base substrate, an organic insulating layer is formed on the first base substrate, and a via hole is formed in the organic insulating layer; the color filter substrate includes a second base substrate, a main spacer and a secondary spacer is formed on the second base substrate, an orthogonal projection of the secondary spacer is located in an orthogonal projection area of the via hole on the first base substrate, and an orthogonal projection of the main spacer is located outside of the orthogonal projection area of the via hole on the first base substrate.

10 Claims, 9 Drawing Sheets

(51) Int. Cl.
*G06F 3/041* (2006.01)
*G02F 1/1333* (2006.01)
*G02F 1/1339* (2006.01)
*G02F 1/1362* (2006.01)

(52) U.S. Cl.
CPC ........ *G02F 1/136227* (2013.01); *G06F 3/044* (2013.01); *G06F 3/0412* (2013.01); *H01L 27/124* (2013.01); *G02F 2001/13396* (2013.01); *G02F 2001/133354* (2013.01); *G06F 2203/04103* (2013.01); *G06F 2203/04111* (2013.01)

(58) Field of Classification Search
USPC .......................................................... 257/72
See application file for complete search history.

(56) References Cited

U.S. PATENT DOCUMENTS

| | | | |
|---|---|---|---|
| 2009/0046227 A1* | 2/2009 | Fan Jiang | G02F 1/133555 349/114 |
| 2009/0079927 A1 | 3/2009 | Yamamoto et al. | |
| 2009/0231522 A1* | 9/2009 | Kim | G02F 1/13394 349/106 |
| 2009/0244422 A1* | 10/2009 | Okazaki | G02F 1/1339 349/42 |
| 2013/0021552 A1* | 1/2013 | Tomioka | G02F 1/13392 349/43 |
| 2014/0071391 A1* | 3/2014 | Yang | G02F 1/133371 349/138 |
| 2014/0198284 A1 | 7/2014 | Weng et al. | |
| 2016/0260931 A1* | 9/2016 | Kim | H01L 51/5271 |
| 2016/0357286 A1* | 12/2016 | Tsai | G06F 3/044 |
| 2016/0370627 A1 | 12/2016 | Tang | |
| 2016/0379578 A1* | 12/2016 | Seo | G09G 3/3611 345/58 |
| 2017/0139255 A1 | 5/2017 | Wu et al. | |
| 2018/0031888 A1* | 2/2018 | Yu | G02F 1/13394 |
| 2018/0224991 A1* | 8/2018 | Gu | G06F 3/041 |

FOREIGN PATENT DOCUMENTS

| | | |
|---|---|---|
| CN | 104597667 A | 5/2015 |
| CN | 104793403 A | 7/2015 |

* cited by examiner

DISPLAY DEVICE AND MANUFACTURING METHOD THEREOF

TECHNICAL FIELD

Embodiments of the present disclosure relate to a display device and a manufacturing method thereof.

BACKGROUND

A display device usually includes an array substrate and a color filter substrate which are cell-assembled together and liquid crystal is distributed between the array substrate and the color filter substrate; a plurality of post spacers (PSs) for supporting the array substrate and the color filter substrate are distributed between them, and the liquid crystal is located in the space supported by the post spacers. The provision of the plurality of post spacers can improve the uniformity of the whole thickness of the display device and the tolerance of the display device to the liquid crystal fluctuation, and then the yield of the display device is improved.

SUMMARY

An embodiment of the present disclosure provides a display device, the display device comprises an array substrate and a color filter substrate which are cell-assembled, the array substrate comprises a first base substrate, an organic insulating layer is formed on the first base substrate, and a via hole is formed in the organic insulating layer; the color filter substrate comprises a second base substrate, a main spacer and a secondary spacer are formed on the second base substrate; an orthogonal projection of the secondary spacer on the first base substrate is located in an orthogonal projection area of the via hole on the first base substrate; and an orthogonal projection of the main spacer on the first base substrate is located outside of the orthogonal projection area of the via hole on the first base substrate.

For example, a height of the main spacer is equal to that of the secondary spacer.

For example, both a longitudinal section of the main spacer and a longitudinal section of the secondary spacer are in trapezoid shapes, and cross sections of the main spacer and the secondary spacer at a same height are the same.

For example, structures of the main spacer and the secondary spacer are in truncated cone shapes or in pyramidal shapes.

For example, an organic insulating buffer layer is formed on the first base substrate which is provided with the organic insulating layer, and a notch is formed at a region of the organic insulating buffer layer corresponding to the via hole.

For example, a range of a depth of the notch is from 1.0 μm to 1.9 μm.

For example, a gate line is formed on the first base substrate; and the organic insulating layer is formed on the first base substrate which is provided with the gate line, the via hole is formed in the organic insulating layer, the orthogonal projection of the via hole on the first base substrate is located in an orthogonal projection area of the gate line on the first base substrate.

Another embodiment of the present disclosure provides a manufacturing method of a display device, and the method comprises: forming an array substrate, wherein forming of the array substrate comprises forming an organic insulating layer on a first base substrate and forming a via hole in the organic insulating layer; forming a color filter substrate, wherein forming of the color filter substrate comprises forming a main spacer and a secondary spacer on a second base substrate; cell-assembling the color filter substrate and the array substrate to allow that an orthogonal projection of the secondary spacer on the first base substrate is located in an orthogonal projection area of the via hole on the first base substrate; an orthogonal projection of the main spacer on the first base substrate is located outside of the orthogonal projection area of the via hole on the first base substrate.

For example, a height of the main spacer is equal to that of the secondary spacer.

For example, both a longitudinal section of the main spacer and a longitudinal section of the secondary spacer are in trapezoid shapes, and cross sections of the main spacer and the secondary spacer at a same height are the same.

For example, structures of the main spacer and the secondary spacer are in truncated cone shapes or in pyramidal shapes.

For example, forming of the array substrate further comprises forming an organic insulating buffer layer on the first base substrate which is provided with the organic insulating layer, and forming a notch at a region of the organic insulating buffer layer corresponding to the via hole.

For example, a range of a depth of the notch is from 1.0 μm to 1.9 μm.

For example, forming of the array substrate further comprises: forming a gate line on the first base substrate; forming the organic insulating layer on the first base substrate which is provided with the gate line; forming the via hole in the organic insulating layer to allow that the orthogonal projection of the via hole on the first base substrate is located in an orthogonal projection area of the gate line on the first base substrate.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

FIG. 2-1 is a schematic structure diagram of another display device provided by an embodiment of the disclosure;

FIG. 2-2 is a schematic structure diagram of another display device provided by the embodiment shown in FIG. 2-1;

FIG. 2-3 is a schematic structure diagram of a display device after being pressed provided by the embodiment shown in FIG. 2-2;

FIG. 2-4 is a bottom view diagram of a display device provided by the embodiment shown in FIG. 2-1;

FIG. 3 is a flow diagram of a manufacturing method of a display device provided by an embodiment of the disclosure;

FIG. 4-1 is a flow diagram of another manufacturing method of a display device provided by an embodiment of the disclosure;

FIG. 4-2 is a schematic structure diagram of an array substrate provided by an embodiment of the disclosure;

FIG. 4-3 is a method flow diagram for forming an array substrate provided by the embodiment as shown in FIG. 4-1;

FIG. 4-4 is a schematic structure diagram for forming a gate line on a first base substrate provided by the embodiment as shown in FIG. 4-3;

FIG. 4-5 is a schematic structure diagram for forming a gate insulating layer on a first base substrate with a gate line provided by the embodiment as shown in FIG. 4-3;

FIG. 4-6 is a schematic structure diagram for forming an active layer on a first base substrate with a gate insulating layer provided by the embodiment as shown in FIG. 4-3;

FIG. 4-7 is a schematic structure diagram for forming a source-drain electrode metal layer on a first base substrate with an active layer provided by the embodiment as shown in FIG. 4-3;

FIG. 4-8 is a schematic structure diagram for forming an organic insulating layer on the first base substrate with a source-drain electrode metal layer provided by the embodiment as shown in FIG. 4-3;

FIG. 4-9 is a schematic structure diagram for forming a via hole on the first base substrate with an organic insulating layer provided by the embodiment as shown in FIG. 4-3;

FIG. 4-10 is a schematic structure diagram for forming a pixel electrode on a first base substrate with an organic insulating layer provided by the embodiment as shown in FIG. 4-2; and FIG. 4-11 is a schematic structure diagram of a color filter substrate provided by an embodiment of the disclosure.

Figure 1:
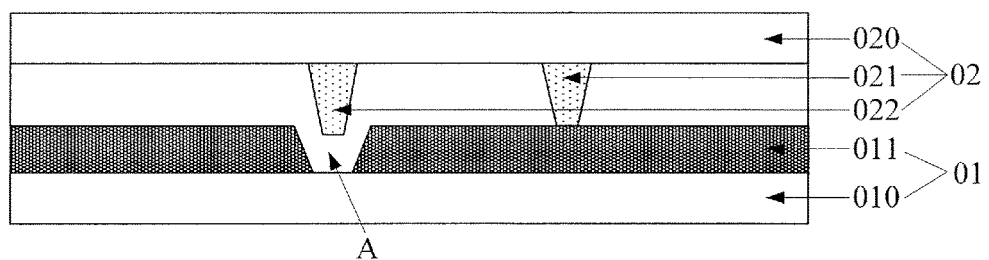
FIG. 1 is a schematic structure diagram of a display device provided by an embodiment of the disclosure.

The drawings here are incorporated in the description and constitute a part of the description to illustrate the embodiments of the disclosure. The drawings and the description are used to explain the principle of the present disclosure but are not limitative.

DETAILED DESCRIPTION

In order to make objects, technical details and advantages apparent, the disclosure will be described in a clearly and fully understandable way in connection with the drawing. Apparently, the described embodiments are just a part but not all of the embodiments of the disclosure. Based on the described embodiments herein, those skilled in the art can obtain other embodiment(s), without any inventive work, which should be within the scope of the disclosure.

The plurality of post spacers disposed between an array substrate and a color filter substrate comprise main spacers (main PSs) and secondary spacers (secondary PSs). There is a mismatch (height difference) between the main spacers and the secondary spacers. A thickness of the display device can be finely tuned by adjusting the mismatch between the main spacers and the secondary spacers. For example, if the height of the main spacers is greater than that of the secondary spacers, the main spacers burden all the pressure and are compressed firstly when the display device is pressed by an external pressure; when the main spacers are compressed and the mismatch between the main spacers and the secondary spacers is reduced close to zero, the main spacers and the secondary spacers will burden the external pressure together. Usually, a half-tone mask can be used to form the main spacers and the secondary spacers on the color filter substrate in a photolithography process, and the half-tone mask contains two regions with different light transmittance. In the process of forming the spacers, the half-tone mask is used to expose the film layer to be exposed on the color filter substrate, and then a development process is used to form the main spacers and the secondary spacers by developing the exposed film layer. The light transmittance of the area of the half tone mask, corresponding to the main spacers, is different from that of the area of the half tone mask, corresponding to the secondary spacers, and the difference causes different exposure degrees and different heights of the main spacers and the secondary spacers.

However, because the half tone mask is expensive, the cost of using the half tone mask to form the spacers is high.

Referring to FIG. 1, a schematic structure diagram of a display device 0 provided by an embodiment of the disclosure is shown. Referring to FIG. 1, the display device 0 includes: an array substrate 01 and a color filter substrate 02 which are cell-assembled together to form a liquid crystal cell for containing liquid crystal therein.

The array substrate 01 comprises a first base substrate 010, an organic insulating layer 011 is formed on the first base substrate 010, and a via hole A is formed in the organic insulating layer 011.

The color filter substrate 02 includes a second base substrate 020, and a main spacer 021 and a secondary spacer 022 are formed on the second base substrate 020.

The orthogonal projection of the secondary spacer 022 is located in the orthogonal projection area of the via hole A in the first base substrate 010; and the orthogonal projection of the main spacer 021 is located outside of the orthogonal projection area of the via hole A on the first base substrate 010.

In the display device provided by the embodiment of the present disclosure, the array substrate includes a first base substrate, an organic insulating layer is formed on the first base substrate, and a via hole is formed in the organic insulating layer; and the color filter substrate includes a second base substrate, and a main spacer and a secondary spacer is formed on the second base substrate, the orthogonal projection of the secondary spacer on the first base substrate is located in the orthogonal projection area of the via hole on the first base substrate, and the orthogonal projection of the main spacer on the first base substrate is located outside of the orthogonal projection area of the via hole on the first base substrate. Because the display device provided by the embodiment of the disclosure use the via hole on the array substrate to implement the mismatch between the main spacer and the secondary spacer, a common mask can be used to form the main spacer and the secondary spacer for saving the forming cost of the spacers. The common mask has a light blocking area and a light transmitting area but has no light partially transparent area (e.g., half-tone area) with light transparency between the light blocking area and the light transmitting area. Thus, the problem of the high cost of using the half-tone mask to form the spacers is resolved, and the effect of saving the cost of forming the spacers is achieved.

Figures 1, 2:
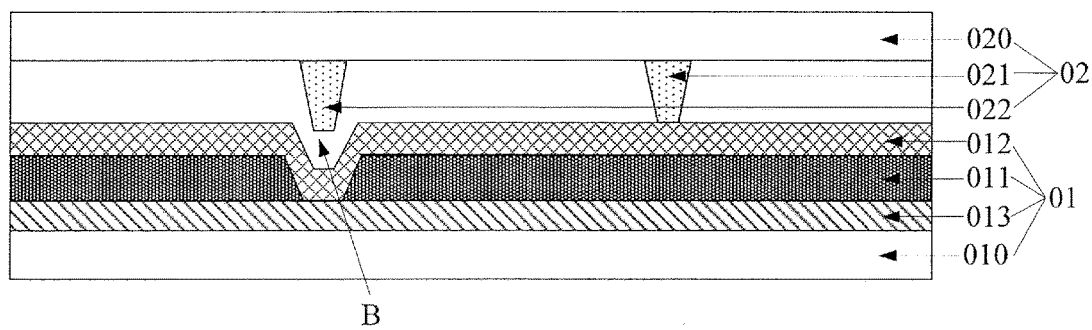
Figure 2:
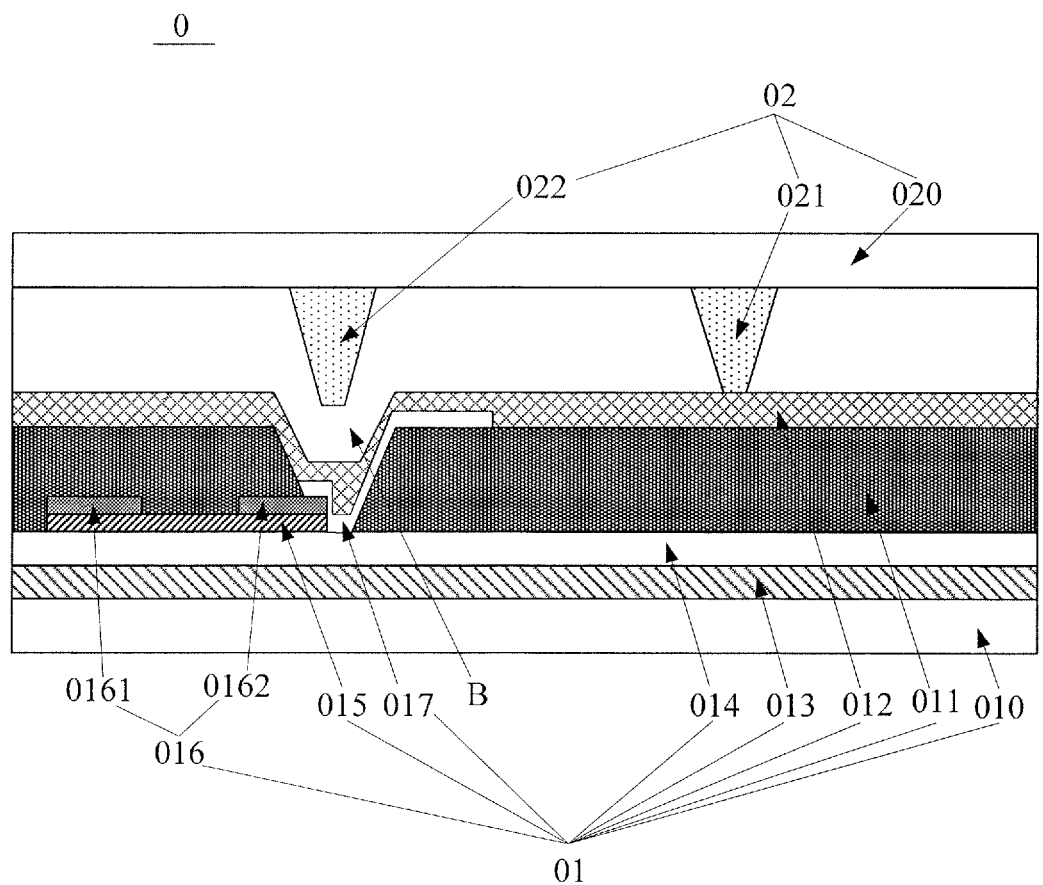

Referring to FIG. 2-1, a schematic structure diagram of another display device 0 provided by an embodiment of the disclosure is shown. Referring to FIG. 2-1, the display device 0 includes: an array substrate 01 and a color filter substrate 02 which are cell-assembled together to form an liquid crystal cell.

The array substrate 01 includes a first base substrate 010, an organic insulating layer 011 is formed on the first base substrate 010, and a via hole A (it is not shown in FIG. 2-1) is formed in the organic insulating layer 011.

The color filter substrate 02 includes a second base substrate 020, and a main spacer 021 and a secondary spacer 022 is formed on the second base substrate 020.

The orthogonal projection of the secondary spacer 022 is located in the orthogonal projection area of the via hole A on the first base substrate 010; the orthogonal projection of the main spacer 021 is located outside of the orthogonal projection area of the via hole A on the first base substrate 010.

For example, in an embodiment of the present disclosure, the height of the main spacer 021 can be equal to that of the secondary spacer 022.

Further, as shown in FIG. 2-1, both a longitudinal section of the main spacer 021 and a longitudinal section of the secondary spacer 022 are in trapezoid shapes, and cross sections of the main spacer 021 and the secondary spacer 022 at a same height are the same as each other. For example, both the structures of the main spacer 021 and the secondary spacer 022 are in truncated cone shapes or both the structures of the main spacer 021 and the secondary spacer 022 are in pyramidal shapes, and the structures are not limited herein in the embodiment of the present disclosure.

Further, continuing to refer to FIG. 2-1, in the array substrate 01, an organic insulating buffer layer 012 is formed on the first base substrate 010 which is provided with the organic insulating layer 011. A notch B is formed by the via hole at the region of the organic insulating buffer layer 012 corresponding to the via hole. In the embodiment of the present disclosure, a thickness of the organic insulating layer 011 can be equal to 2 μm, a range of the depth of the notch B is from 1.0 μm to 1.9 μm, and this range of the depth of the notch B is the range of the mismatch between the main spacer 021 and the secondary spacer 022. As shown in FIG. 2-1, after the array substrate 02 and the color filter substrate are cell-assembled together, the main spacer 021 suffers from a certain amount of compression, at this time, the secondary spacer 022 is not in contact with the bottom of the notch B; when at least one of the array substrate 01 and the color filter substrate 02 is subjected to an external pressure, the main spacer 021 burdens the force and is compressed firstly, when the main spacer 021 is compressed to such a degree that the secondary spacer 022 is in contact with the bottom of the notch B, the main spacer 021 and the secondary spacer 022 will burden the external pressure together.

Further, continuing to refer to FIG. 2-1, a gate line 013 is formed on the first base substrate 010. An organic insulating layer 011 is formed on the first base substrate 010 which is provided with the gate line 013. A via hole is formed in the organic insulating layer 011, an orthogonal projection of the via hole is located in an orthogonal projection area of the gate line 013 on the first base substrate 010. An organic insulating buffer layer 012 is formed on a the base substrate 010 provided with the organic insulating layer 011, a notch B formed by the via hole is formed at the region of the organic insulating buffer layer 012 corresponding to the via hole, and the orthogonal projection of the secondary spacer 022 is located in the orthogonal projection area of the notch B on the first base substrate 010.

Further, referring to FIG. 2-2, a schematic structure diagram of another display device 0 provided by the embodiment as shown in FIG. 2-1. In FIG. 2-2, the display device 0 includes an array substrate 01 and a color filter substrate 02 which are cell-assembled together to form a liquid crystal cell. The array substrate 01 includes a first base substrate 010, a gate line 013 is formed on the first base substrate 010, a gate insulating layer 014 is formed on the first base substrate 010 provided with the gate line 013, an active layer 015 is formed on the first base substrate 010 provided with the gate insulating layer 014, and a source-drain electrode metal layer 016 is formed on the first base substrate 010 provided with the active layer 015. The source-drain electrode metal layer 016 includes a source electrode 0161 and a drain electrode 0162, the source electrode 0161 is not in contact with the drain electrode 0162, and both the source electrode 0161 and the drain electrode 0162 are in contact with the active layer 015. An organic insulating layer 011 is formed on the first base substrate 010 provided with the source-drain electrode metal layer 016, a via hole (it is not shown in FIG. 2-2) is formed in the organic insulating layer 011, and a pixel electrode 017 is formed on the first base substrate 011 which is provided with the organic insulating layer 011. The pixel electrode 017 is in contact with the drain electrode 0162 through the via hole in the organic insulating layer 011. An organic insulating buffer layer 012 is formed on the first base substrate 010 provided with the pixel electrode 017, a notch B formed by the via hole in the organic insulating layer 011 is formed at the region of the organic insulating buffer layer 012 corresponding to the via hole.

As shown in FIG. 2-2, the color filter substrate 02 includes a second base substrate 020. A main spacer 021 and a secondary spacer 022 are formed on the second base substrate 020. The height of the main spacer 021 is equal to the height of the secondary spacer 022. The orthogonal projection of the secondary spacer 022 is located in the orthogonal projection area of the notch B on the first base substrate 010, and the orthogonal projection of the main spacer 021 is located outside of the orthogonal projection area of the notch B on the first base substrate 010. This can implement the mismatch between the main spacer 021 and the secondary spacer through the notch B.

Figures 2, 3:
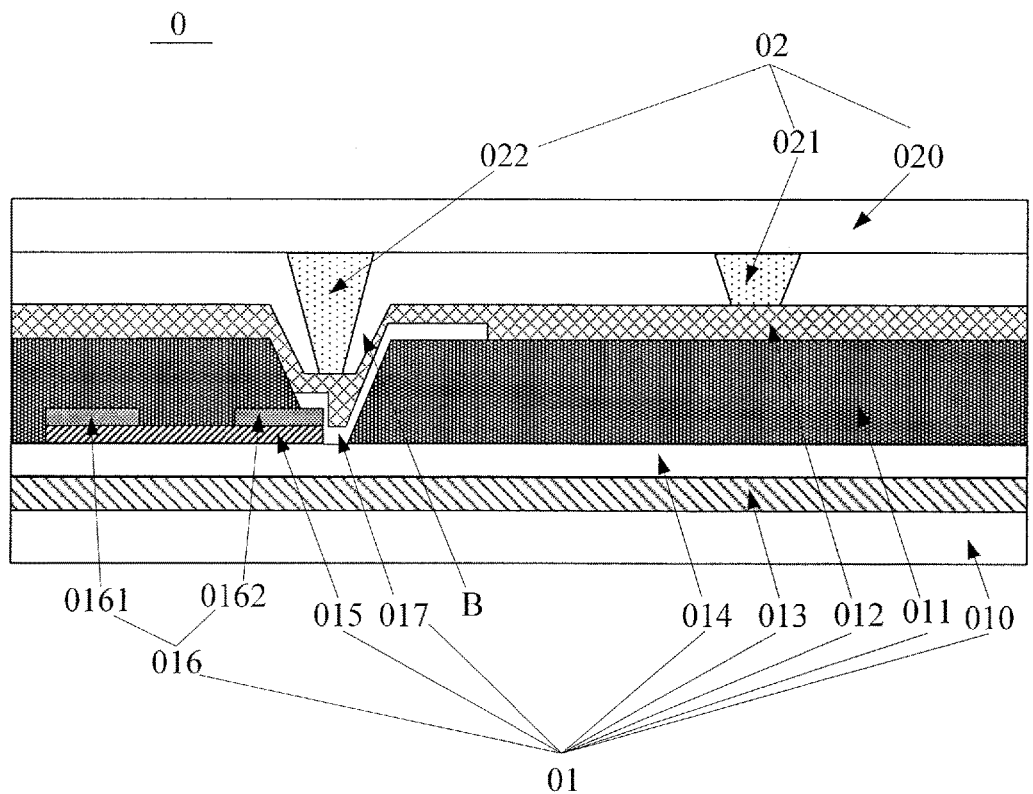

In the embodiment of the present disclosure, when at least one of the array substrate 01 and the color filter substrate 02 is subjected to an external pressure, the main spacer 021 burdens the pressure and is compressed first; when the main spacer 021 is compressed to such a degree that the secondary spacer 022 is in contact with the bottom of the notch B, the main spacer 021 and the secondary spacer 022 will burden the external pressure together. For example, referring to FIG. 2-3, a schematic structure diagram of a display device under compression provided by the embodiment as shown in FIG. 2-2 is illustrated. In FIG. 2-3, after the display device is pressed by the external force, the main spacer 021 is compressed, and then the secondary spacer is in contact with the bottom of the notch B. At this time, the main spacer 021 and the secondary spacer 022 will burden the external pressure together. It should be understood that the display device 0 will restore the original state as shown in FIG. 2-2 when the external pressure is removed. In the embodiment of the present disclosure, the mismatch between the main spacer 021 and the secondary spacer 022 can be finely tuned or adjusted by the shape change amount of the spacer.

It should be understood that in practice, for the array substrate 01, a plurality of gate lines 013 and a plurality of data lines are formed on a first base substrate 010, and each data line is crossed with all the gate lines 013. Two adjacent data lines and two adjacent gate lines 013 define a pixel area. A pixel electrode 017 is formed in each pixel region. The array substrate 01 further includes a driving device. For example, the driving device can be a thin film transistor (TFT). A TFT includes a gate electrode, a source electrode and a drain electrode, the gate electrode of the TFT is connected to the gate line 013, and the gate electrode and the gate line 013 are usually provided in a same layer. Therefore, the gate electrode and the gate line 013 can be formed in same one patterning process. The source electrode of TFT is connected to the data line, the drain electrode is connected to the pixel electrode, and the source electrode, the drain electrode, and the data line of TFT are usually provided in the same layer. Therefore, same one patterning process can be used to form the source electrode, the drain electrode, and the data line, which will not be described herein for simplicity in the embodiment of the present disclosure.

Figures 2, 3, 4:
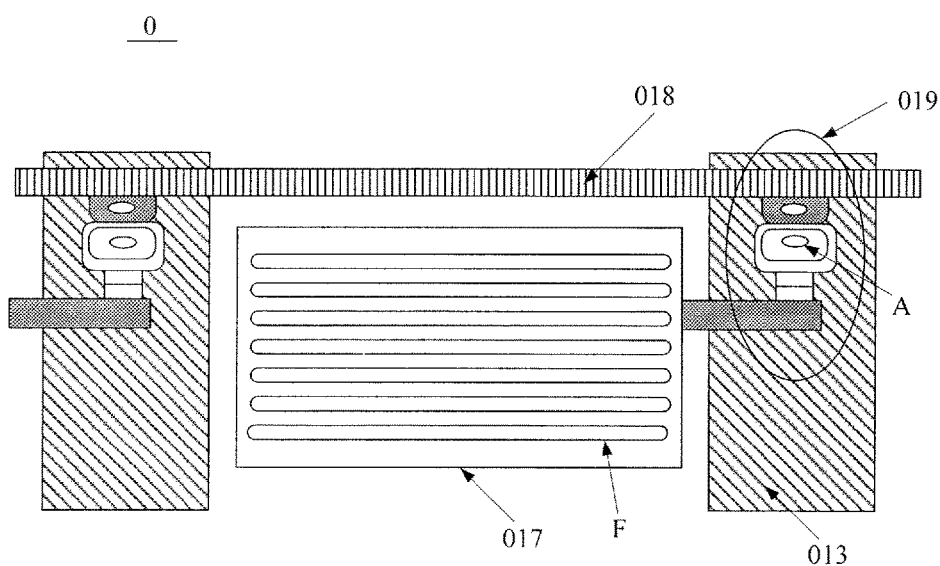
Figure 3:
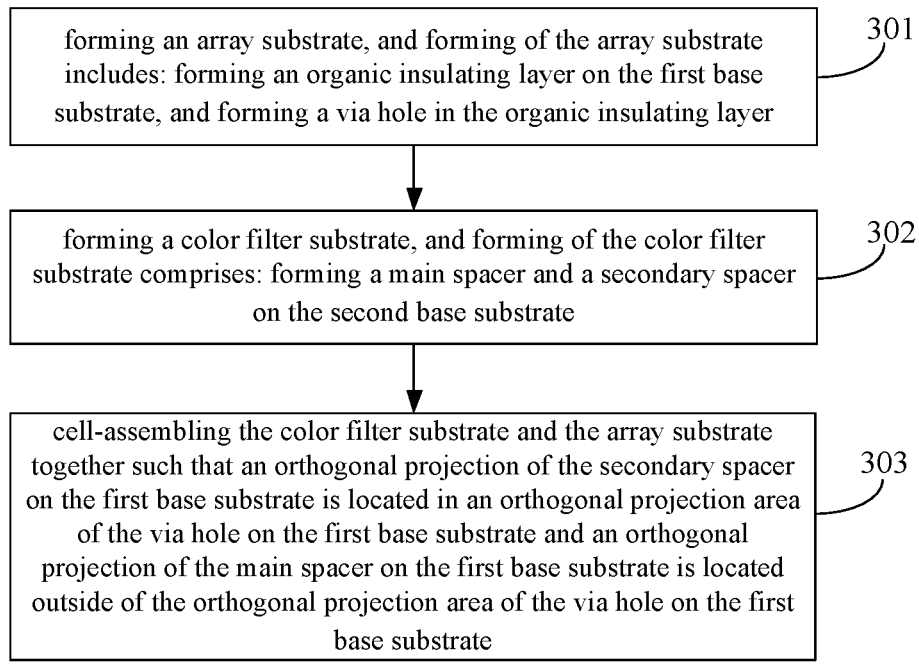

For example, referring to FIG. 2-4, the bottom view diagram of a display device provided by the embodiment in FIG. 2-1 is shown. In FIG. 2-4, a gate line 013, a data line 018 and an organic insulating layer (it is not shown in FIG. 2-4) are formed on a first base substrate (it is not shown in FIG. 2-4). A via hole A is formed in the organic insulating layer, and a pixel electrode 017 is formed in the pixel region defined by the gate line 013 and the data line 018. The pixel electrode 017 is formed with a slit F. Moreover, the array substrate further includes a TFT 019, the gate electrode of the TFT 019 (it is not shown in FIG. 2-4) is connected to the gate line 013, the source electrode (it is not shown in FIG. 2-4) is connected to the data line 018, and the drain electrode (it is not shown in FIG. 2-4) is connected to the pixel electrode 017. As shown in FIG. 2-4, the orthogonal projection of the TFT 019 is located in the orthogonal projection area of the gate line 013 on the first base substrate. The orthogonal projection of the via hole A is located in the orthogonal projection area of the gate line 013 on the first base substrate. As shown in FIG. 2-2 or FIG. 2-3, in practice, the active layer 015 on the array substrate is located right below the source-drain metal layer 016. As shown in FIG. 2-4, the orthogonal projection of the TFT 019 is located in the orthogonal projection area of the gate line 013 on the first base substrate, and the orthogonal projection of the active layer is located in the orthogonal projection area of the gate line 013 on the first base substrate. In this way, the active layer can be protected by the gate line 013, and the impact of light on the active layer can be reduced.

It should be understood that in the display device provided by the embodiment of the present disclosure, the organic insulating layer 011 is made of an organic resin material with a low dielectric constant. Because it is easy to coat the organic resin material with a low dielectric constant, the organic insulating layer 011 can be formed by coating a thicker layer of the organic resin material, thus, the parasitic capacitance between the signal line and the pixel electrode 017 is reduced, and this can avoid the disadvantages of the methods such as a chemical vapor deposition method (CVD) for forming an organic insulating layer 011 with overly high requirements and a longer process time period.

In the display device provided by the embodiment of the present disclosure, the array substrate includes a first base substrate, an organic insulating layer is formed on the first base substrate, and a via hole is formed in the organic insulating layer, the color filter substrate includes a second base substrate, and a main spacer and a secondary spacer are formed on the second base substrate, the orthogonal projection of the secondary spacer is located in the orthogonal projection area of the via hole on the first base substrate, and the orthogonal projection of the main spacer is located outside of the orthogonal projection area of the via hole on the first base substrate. Because the display device provided by the embodiment of the present disclosure use the via hole on the array substrate to implement the mismatch between the main spacer and the secondary spacer, a common mask can be used to form the main spacer and the secondary spacer, saving the forming cost of the spacers. Thus, the problem of the high cost of using the half-tone mask to form the spacers can be resolved, and the effect of saving the cost of forming the spacers is achieved.

When a half-tone mask is used to form both main spacers and secondary spacers over a substrate, due to the limitation on the manufacturing process of the half-tone mask, the consistency of the exposure amount in each area of the half-tone mask is difficult to control, which causes the consistency among the main spacers to be lower, the consistency among the secondary spacers to be lower as well, and the stability for manufacturing the spacers to be also lower. However in the embodiment of the present disclosure, a common mask can be used to form the main spacers and the secondary spacers. As the exposure amount in each area of the common mask is substantially the same, the consistency among the main spacers and secondary spacers becomes higher, and the stability for manufacturing the spacer becomes also higher.

The manufacture of main spacers and secondary spacers can be implemented by designing different apertures on the spacer mask (that is, the mask for forming the spacers). For example, the spacer mask includes two kinds of openings with two different apertures, the kind of the openings having the bigger aperture corresponds to the main spacers, and the kind of the openings having the smaller aperture corresponds to the secondary spacers. The spacer mask can be used to implement the manufacture of main spacers and secondary spacers, but the range of the mismatch between the main spacers and the secondary spacers manufactured by using the spacer mask is generally from 0.2 µm to 0.4 µm. Therefore, the mismatch between the main spacers and the secondary spacers manufactured by using the spacer mask is small, which causes that the tolerance of the display device to the liquid crystal fluctuation is lower and the yield of the display device is lower, and the display device may be suitable to be applied in some low-end products, but for high-end products, especially touch screen products, thus obtained display devices cannot meet the application requirements. In contrast, in the display device provided by the embodiment of the present disclosure, the range of the depth of the notch is from 1.0 µm to 1.9 µm, thus the range of the mismatch between the main spacers and the secondary spacers, which is produced due to the notch, is generally from 1.0 µm to 1.9 µm. The bigger the mismatch between the main spacers and the secondary spacers is, the higher the tolerance of the display device to the liquid crystal fluctuation is, and the yield of the display device is improved, so the display device can be applied to high-end products.

A common mask can be used to form the main spacers and the secondary spacers in the display device provided by the embodiment of the present disclosure, the margin of the liquid crystal (LC) in display device is improved, especially in the touch screen area, the stability of the touch screen display is improved, at the same time the manufacturing process flow and cost of the display device provided by the embodiment of the present disclosure is not increased during the manufacturing process.

The display device provided by the embodiments of the present disclosure can be applied to the following method, and the manufacturing method and the manufacturing principle of the display device in the embodiments of the present disclosure will be described in the following embodiments in detail.

Referring to FIG. 3, a flow diagram of a manufacturing method of a display device provided by an embodiment of the disclosure is shown. The manufacturing method of the display device can be used for manufacturing the display device 0 as shown in FIG. 1 to FIG. 2-2. Referring to FIG. 3, the manufacturing method of the display device includes the following operations.

Step 301: forming an array substrate. The operation of forming an array substrate includes: forming an organic insulating layer on a first base substrate, and forming a via hole in the organic insulating layer.

Step 302: forming a color filter substrate. The operation of forming a color filter substrate comprises: forming a main spacer and a secondary spacer on the second base substrate;

Step 303: cell-assembling the color filter substrate and the array substrate together such that an orthogonal projection of the secondary spacer is located in the orthogonal projection area of the via hole on the first base substrate and an orthogonal projection of the main spacer is located outside of the orthogonal projection area of the via hole on the first base substrate.

The manufacturing method of the display device provided by the embodiment of the present disclosure includes forming an array substrate and a color filter substrate, wherein forming of an array substrate includes forming an organic insulating layer on the first base substrate, and forming a via hole in the organic insulating layer. Forming a color filter substrate includes forming a main spacer and a secondary spacer on the second base substrate, and cell-assembling the color filter substrate and the array substrate together to allow the orthogonal projection of the secondary spacer to be located in the orthogonal projection area of the via hole on the first base substrate and the orthogonal projection of the main spacer to be located outside of the orthogonal projection area of the via hole on the first base substrate. Because the display device manufactured by the manufacturing method of the display device provided by the embodiment of the disclosure uses the via hole on the array substrate to achieve the height difference between the main spacer and the secondary spacer, a common mask can be used to form the main spacer and the secondary spacer for saving the forming cost of the spacers. Thus, the problem of the high cost of using the half-tone mask to form the spacers can be resolved, and the effect of saving the cost of forming the spacers is achieved.

For example, a height of the main spacer can be equal to that of the secondary spacer.

For example, both a longitudinal section of the main spacer and a longitudinal section of the secondary spacer are in trapezoid shapes, and the cross sections of the main spacer and the secondary spacer at a same height are the same.

For example, both the structure of the main spacer and the structure of the secondary spacer are in the truncated cone shapes, or both the structure of the main spacer and the structure of the secondary spacer are in pyramidal shapes.

For example, the operation of forming the array substrate further includes: forming an organic insulating buffer layer on a first base substrate provided with the organic insulating layer, forming a notch in a region of the organic insulating buffer layer corresponding to the via hole. The range of the depth of the notch is from 1.0 μm to 1.9 μm.

For example, the operation of forming the array substrate includes: forming a gate line on the first base substrate; forming an organic insulating layer on the first base substrate provided with the gate line; forming a via hole in the organic insulating layer to allow that the orthogonal projection of the secondary spacer is located in the orthogonal projection area of the via hole on the first base substrate.

For all the above optional technical solutions, an arbitrary combination among them can be used to form an optional embodiment of the present disclosure, which will not be described herein for simplicity.

The manufacturing method of the display device provided by the embodiment of the present disclosure may include forming an array substrate and a color filter substrate, wherein forming of an array substrate includes forming an organic insulating layer on the first base substrate, and forming a via hole in the organic insulating layer. Forming of a color filter substrate includes forming a main spacer and a secondary spacer on the second base substrate, and cell-assembling the color filter substrate and the array substrate such that the orthogonal projection of the secondary spacer is located in the orthogonal projection area of the via hole on the first base substrate and the orthogonal projection of the main spacer is located outside of the orthogonal projection area of the via hole on the first base substrate. Because the display device which is manufactured by the manufacturing method of the display device provided by the embodiment of the present disclosure uses the via hole on the array substrate to achieve the height difference between the main spacer and the secondary spacers, a common mask can be used to form the main spacer and the secondary spacer for saving the forming cost of the spacers. Thus, the problem of the high cost of using the half-tone mask to form the spacers can be resolved, and the effect of saving the cost of forming the spacers is achieved.

Referring to FIG. 4-1, a flow diagram of another manufacturing method of a display device provided by an embodiment of the disclosure is shown, and the manufacturing method of the display device can be used for manufacturing the display device 0 as shown in FIG. 1 to FIG. 2-2. The embodiment of the present disclosure is illustrated by the example of the manufacture of the display device 0 as shown in FIG. 2-2, and the display device 0 as shown in FIG. 1 or FIG. 2-1 can be manufactured by using part of the steps in FIG. 4-1. Referring to FIG. 4-1, the manufacturing method of the display device may include the following operations.

Step 401: forming an array substrate. The array substrate includes a first base substrate, and an organic insulating layer is formed on the first base substrate and a via hole is formed in the organic insulating layer.

Referring to FIG. 4-2, a schematic structure diagram of an array substrate provided by an embodiment of the present disclosure is shown. Referring to FIG. 4-2, the array substrate 01 includes a first base substrate 010, the first base substrate 010 is sequentially formed with a gate line 013, a gate insulating layer 014, an active layer 015, a source-drain electrode metal layer 016, an organic insulating layer 011, a pixel electrode 017 and an organic insulating buffer layer 012; the source-drain metal layer 016 includes a source electrode 0161 and a drain electrode 0162, the source electrode 0161 is not in contact with the drain electrode 0162, and the source electrode 0161 and the drain electrode 0162 are in contact with the active layer 015. A via hole (it is not shown in FIG. 4-2) is formed in the organic insulating layer 011, the pixel electrode 017 is in contact with the drain electrode 0162 through the via hole disposed in the organic insulating layer 011, and the via hole disposed in the organic insulating layer produces a notch B at the corresponding region of the organic insulating buffer layer 012.

Referring to FIG. 4-3, a method flow diagram for forming an array substrate provided by the embodiment in FIG. 4-1 is shown. The method of forming an array substrate can be used to form an array substrate 01 as shown in FIG. 4-2. Referring to FIG. 4-3, the flow of the method may include the following operations.

Sub-step 4011: forming a gate line on the first base substrate.

Referring to FIG. 4-4, a schematic structure diagram for forming a gate line on a first base substrate provided by the embodiment in FIG. 4-3 is shown, and a metal material can be used to form a gate line 013.

For example, the methods of coating, magnetron sputtering, thermal evaporation or plasma enhanced chemical vapor deposition (PECVD) can be used to deposit a layer of metal material on the first base substrate 010 to form a metal film layer, then one patterning process is used to process the metal film layer to obtain a gate line 013, the patterning process includes the steps of photoresist coating, photoresist exposing, photoresist developing, etching, photoresist stripping and so on. Therefore, using one patterning process to process the metal film layer to obtain the gate line 013 includes: coating a photoresist layer with a certain thickness on the metal film layer, using a mask to expose the photoresist so that the photoresist can form a fully exposed area and a non-exposed area, then conducting a development process, so that the fully exposed area of the photoresist layer is completely removed and the non-exposed area of the photoresist layer is completely retained, conducting an etching process to etch the region of the metal film layer corresponding to the fully exposed area, and then removing the photoresist in the non-exposed area to form a gate line at the region on the metal film layer corresponding to the non-exposed area.

It should be understood that the embodiment of the present disclosure is described by using positive photoresist to form a gate line 013 as an example. In practices, negative photoresist can also be used to form a gate line 013, and the photoresist is not limited herein in the embodiment of the present disclosure.

It should be understood that in practice the array substrate further includes a TFT. The TFT includes a gate electrode, a source electrode, and a drain electrode, and the gate electrode is connected to the gate line. Therefore, at the time of forming the gate line 013, the gate electrode of the TFT can be formed on the first base substrate 010. In other words, the gate electrode and the gate line are formed in one patterning process, which is not limited herein in the embodiment of the present disclosure.

Sub-step 4012: forming a gate insulating layer on the first base substrate provided with a gate line.

Figures 1, 4:
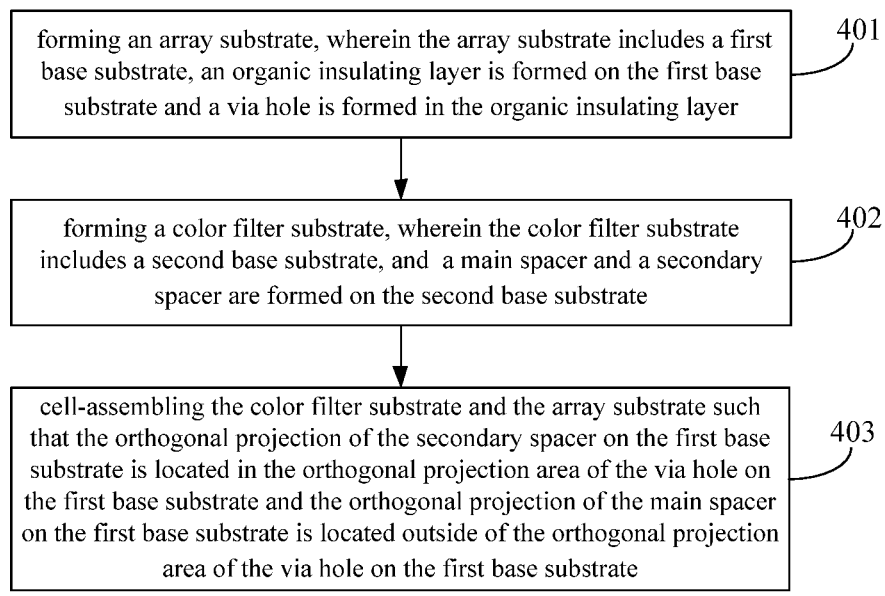
Figures 2, 4:
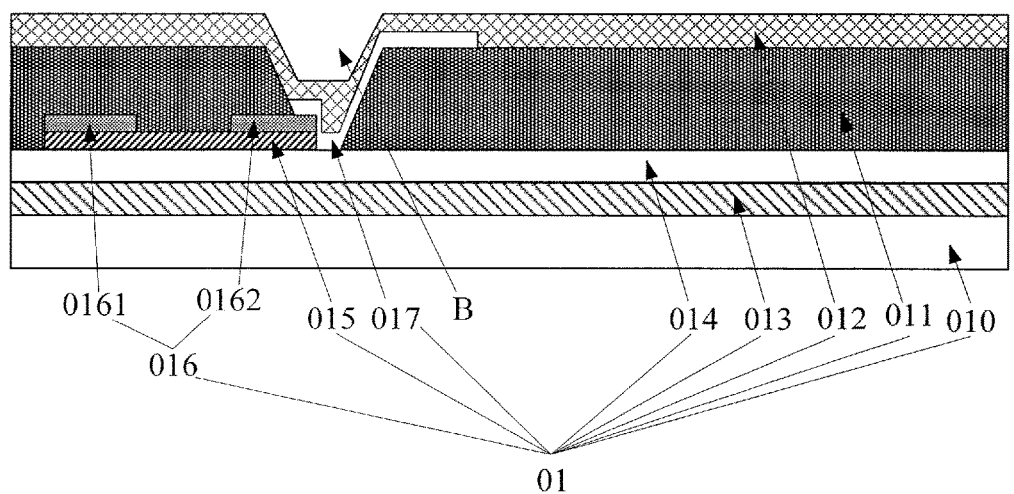
Figures 3, 4:
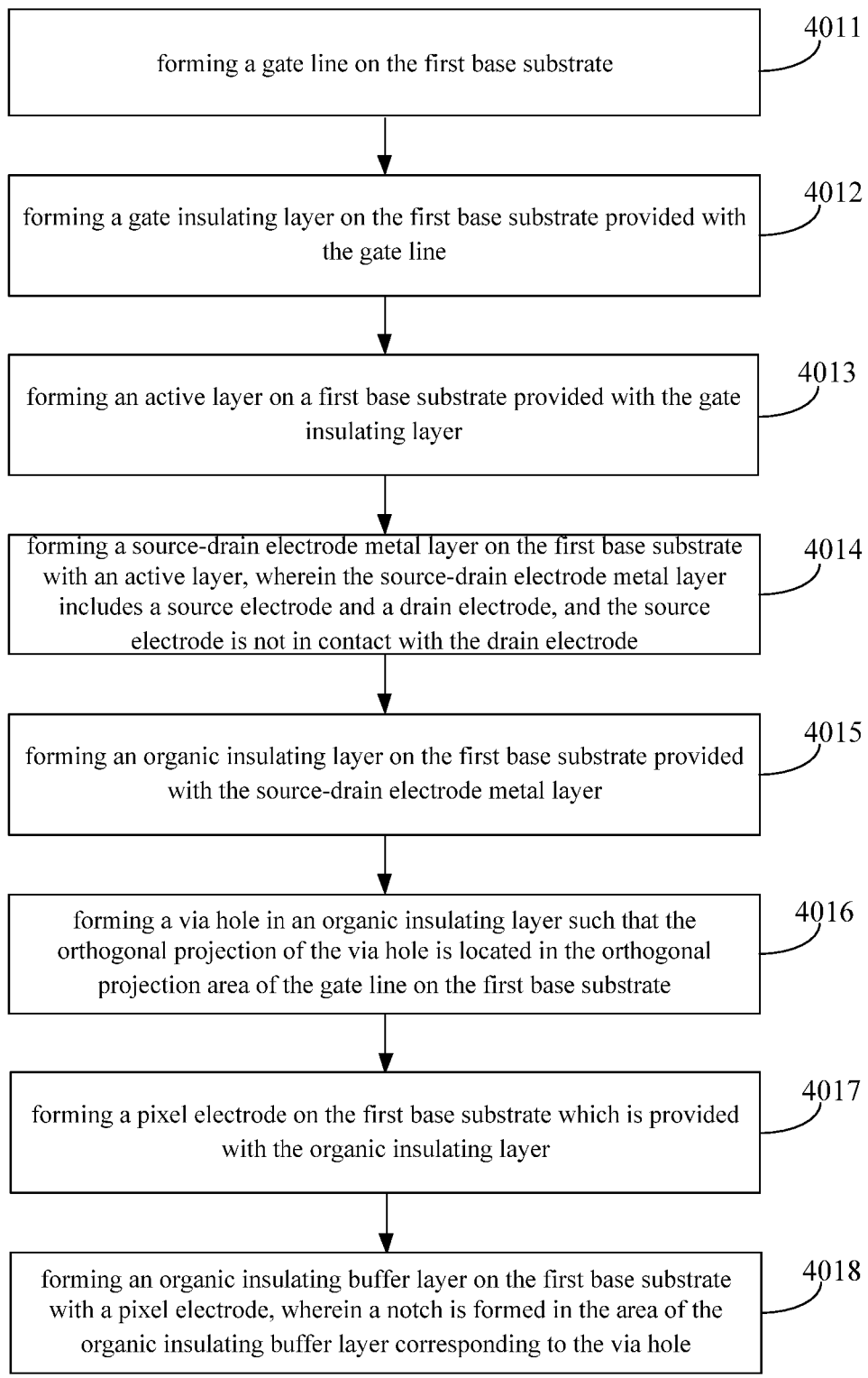
Figure 4:
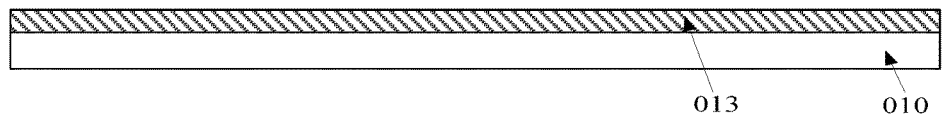
Figures 4, 5:
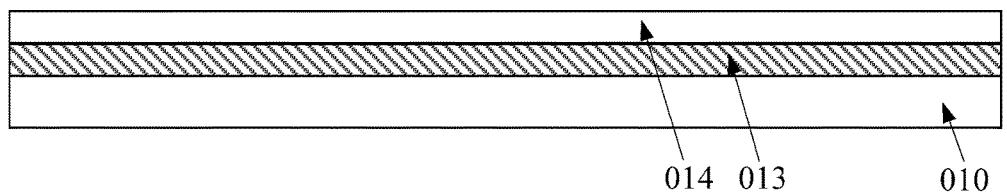

Referring to FIG. 4-5, a schematic structure diagram for forming a gate insulating layer 014 on the first base substrate 010 with the gate line 013 provided by the embodiment in FIG. 4-3 is shown; the gate insulating layer 014 is made of an organic resin material, and the thickness of the gate insulating layer 014 can be set according to needs. The thickness is not limited herein in the embodiment of the present disclosure.

For example, the methods of coating, magnetron sputtering, thermal evaporation or PECVD can be used to deposit a layer of organic resin film with a certain thickness on the first base substrate 010 which is provided with a gate line 013 to form an insulating layer 014; the gate insulating layer 014 can be made of oxide, nitride or oxygen-nitrogen compound. Correspondingly the reaction gas can be a gas mixture of $SiH_4$ (silicon tetrahydride), $NH_3$ (ammonia) and $N_2$ (nitrogen) or a gas mixture of $SiH_2Cl_2$ (dichlorosilane), $NH_3$ and $N_2$.

It should be understood that in practice, the array substrate 01 can further include a data line. The gate insulating layer 014 which is formed on the first base substrate 010 provided with the gate line 013 in the embodiment of the present disclosure can insulate the gate line 013 from the data line.

It should be further understood that in practice, when the gate insulating layer 014 includes a pattern, the organic resin film can be processed by the patterning process to obtain the gate insulating layer 014 including the pattern, which will not be described herein for simplicity in the embodiment of the present disclosure.

Sub-step 4013: forming an active layer on the first base substrate provided with the gate insulating layer.

Figures 4, 5, 6:
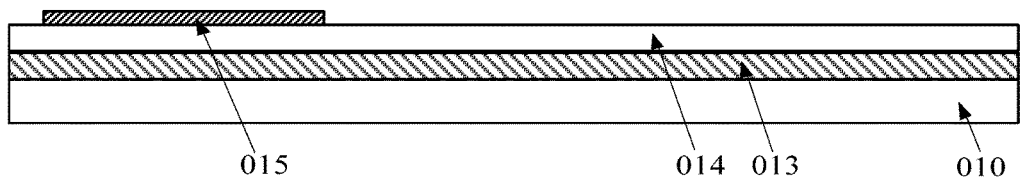
Figures 4, 5, 6, 7:
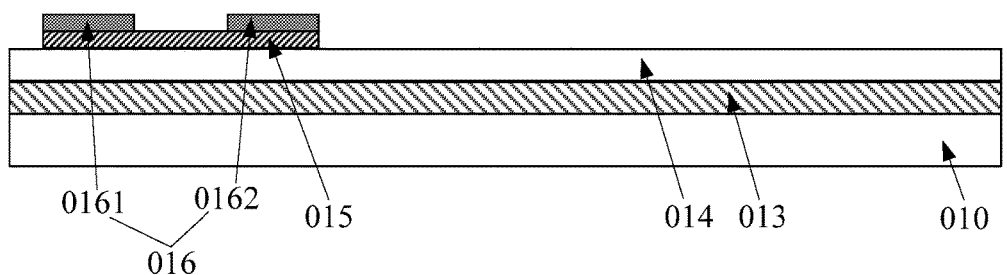
Figures 4, 5, 6, 7, 8:
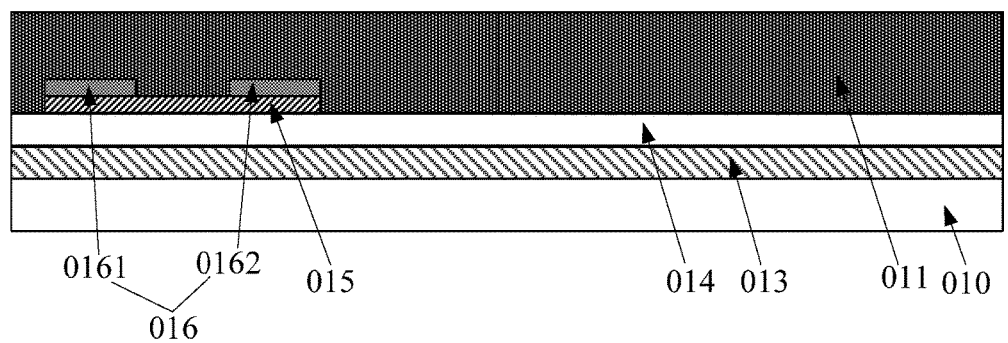
Figures 4, 5, 6, 7, 8, 9:
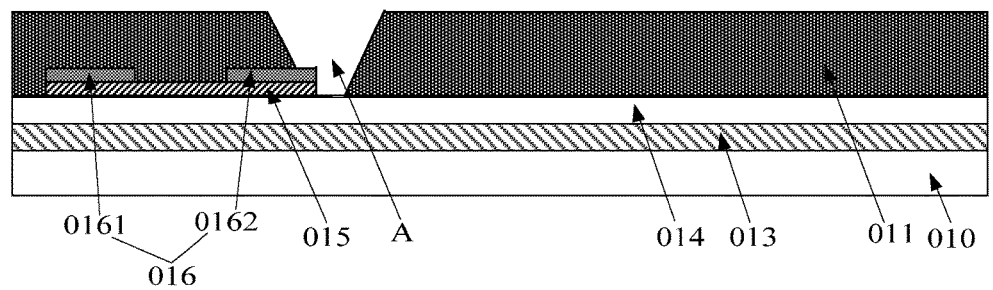
Figures 4, 5, 6, 7, 8, 9, 10:
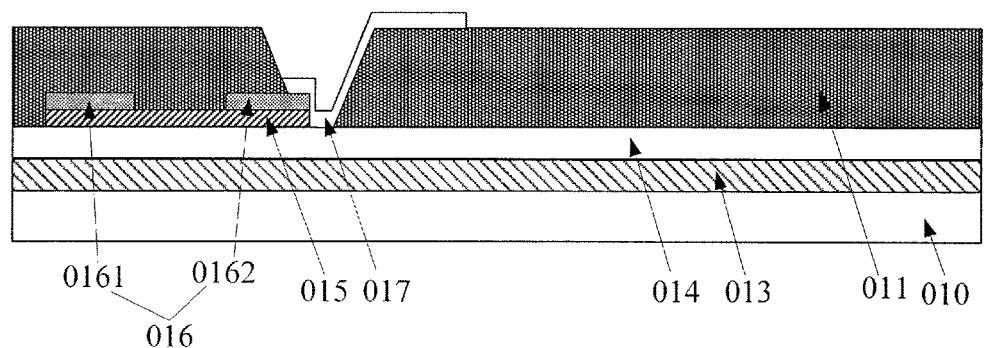
Figures 4, 5, 6, 7, 8, 9, 10, 11:
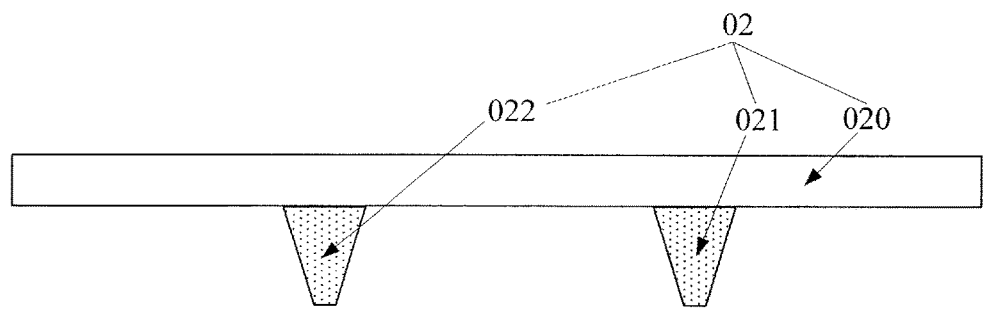

Referring to FIG. 4-6, a schematic structure diagram for forming an active layer 015 on the first base substrate 010 with a gate insulating layer 014 provided by the embodiment in FIG. 4-3 is shown; the active layer 015 can be formed by a polysilicon material, the thickness of the active layer 015 can be set according to needs. The thickness is not limited herein in the embodiment of the present disclosure.

For example, the methods of coating, magnetron sputtering, thermal evaporation or PECVD can be used to deposit a layer of polycrystalline silicon material on the first base substrate 010 to form a polycrystalline silicon film layer, then one patterning process is used to process the polycrystalline silicon film layer to obtain an active layer 13; one patterning process includes the steps of photoresist coating, photoresist exposing, photoresist developing, etching, photoresist stripping and so on. Therefore, applying one patterning process to the polycrystalline silicon film layer to obtain the active layer 015 can include: coating a photoresist layer with a certain thickness on the polycrystalline silicon film layer, using a mask to expose the photoresist so that the photoresist can form a fully exposed area and a non-exposed area, then using the development process to develop it so that the fully exposed area of the photoresist is completely removed and the non-exposed area of the photoresist is completely retained, using an etching process to etch the region of the metal film layer corresponding to the fully exposed area, and then the photoresist in the non-exposed area is removed to form an active layer 015 at the region of the polycrystalline silicon film layer corresponding to the non-exposed area.

It should be understood that in the embodiment of the present disclosure positive photoresist is used to form an active layer 015 as an example. In practice, negative photoresist can also be used to form an active layer 015, which will not be described herein for simplicity in the embodiment of the present disclosure.

Sub-step 4014: forming a source-drain electrode metal layer on the first base substrate with the active layer. The source-drain electrode metal layer includes a source electrode and a drain electrode, and the source electrode is not in contact with the drain electrode.

Referring to FIG. 4-7, a schematic structure diagram for forming a source-drain electrode metal layer on the first base substrate with an active layer provided by the embodiment in FIG. 4-3 is shown. Referring to FIG. 4-7, the source-drain electrode metal layer 016 includes a source electrode 0161 and a drain electrode 0162, both the source electrode 0161 and the drain electrode 0162 are in contact with the active layer 015, and the source electrode 0161 is not in contact with the drain electrode 0162, the source-drain electrode metal layer 016 can be made of a metal material, and the thickness of the source-drain electrode metal layer 016 can be set according to needs. The thickness is not limited herein in the embodiment of the present disclosure.

For example, the methods of coating, magnetron sputtering, thermal evaporation or PECVD can be used to deposit a layer of metal material on the first base substrate 010 with the active layer 015 to form a metal film layer, then one patterning process is used to process the metal film layer to obtain a source drain electrode metal layer 016; one patterning process includes the steps of photoresist coating, photoresist exposing, photoresist developing, etching, photoresist stripping and so on. Therefore, using one patterning process to process the metal film layer to obtain the source drain electrode metal layer 016 includes: coating a photoresist layer with a certain thickness on the metal film layer, using a mask to expose the photoresist layer so that the photoresist can form a fully exposed area and a non-exposed area, then using a development process to the photoresist layer so that the fully exposed area of the photoresist layer is completely removed and the non-exposed area of the photoresist layer is completely retained, using the etching process to etch the region of the metal film layer corresponding to the fully exposed area, and then removing the photoresist in the non-exposed area to form a source-drain electrode metal layer 016 at the region of the metal film layer corresponding to the non-exposed area.

It should be understood that the embodiment of the present disclosure is described by using positive photoresist to form a source drain electrode metal layer 016 as an example. In practice, negative photoresist can also be used to form a source-drain electrode metal layer 016. The photoresist is not limited herein in the embodiment of the present disclosure.

Sub-step 4015: forming an organic insulating layer on the first base substrate provided with the source-drain electrode metal layer.

Referring to FIG. 4-8, a schematic structure diagram for forming an organic insulating layer 011 on the first base substrate 010 with the source-drain electrode metal layer 016 provided by the embodiment in FIG. 4-3 is shown; the organic insulating layer 011 can be formed by adopting an organic resin material, and the thickness of the organic insulating layer 011 can be set according to needs, and for example, the thickness of the organic insulating layer 011 is equal to 2.0 µm. The thickness is not limited herein in the embodiment of the present disclosure. In the embodiment of the disclosure, an organic insulating layer 011 is formed by coating a layer of organic resin material on the first base substrate 010 with the source-drain electrode metal layer 016.

Sub-step 4016: forming a via hole in an organic insulating layer such that the orthogonal projection of the via hole is located in the orthogonal projection area of the gate line on the first base substrate.

Referring to FIG. 4-9, a schematic structure diagram for forming a via hole on a first base substrate with an organic insulating layer provided by the embodiment in FIG. 4-3 is shown. Referring to FIG. 4-9, after forming the via hole A, the corresponding area of the via hole A on the drain 0162 is uncovered. It should be understood that as the thickness of the organic insulating layer 011 is equal to 2.0 µm, and therefore the depth of the via hole A is equal to 2.0 µm.

One patterning process is used to form a via hole A in the organic insulating layer 011. One patterning process includes the steps of photoresist coating, photoresist exposing, photoresist developing, etching, photoresist stripping and so on. Therefore, applying one patterning process to the organic insulating layer 011 to form the via hole A includes: coating a photoresist layer with a certain thickness on the organic insulating layer, using a mask to expose the photoresist layer so that the photoresist layer can form a fully exposed and a non-exposed area, then processing the exposed photoresist layer in a development process so that the fully exposed area of the photoresist layer is completely removed and the non-exposed area of the photoresist layer is completely retained so as to obtain a photoresist pattern, using an etching process with the photoresist pattern as an etching mask to etch the region of the organic insulating layer 011 corresponding to a fully exposed area, and then stripping the photoresist in the non-exposed area to form the via hole A at the region of the organic insulating layer 011 corresponding to the non-exposed area.

It should be understood that the embodiment of the disclosure is described by using positive photoresist to form the via hole A as an example. In practice, negative photoresist can also be used to form the via hole A. The photoresist used is not limited herein in the embodiment of the present disclosure.

It should be further understood that in practice, the via hole A can be directly formed in the organic insulating layer 011. For example, a mask plate is used to expose the organic insulating layer 011 so that a fully exposed area and a non-exposed area can be formed in the organic insulating layer 011, then a development process is used to develop the exposed organic insulating layer so that the fully exposed area of the organic insulating layer is completely removed and the non-exposed area of the organic insulating layer is completely retained, the via hole A being formed at the area of the organic insulating layer 011 corresponding to the fully exposed area. In the embodiment of the present disclosure, whether the etching is necessary or not when forming the via hole A can be determined according to the material forming the organic insulating layer 011, which will not be described herein for simplicity in the embodiment of the present disclosure.

Sub-step 4017: forming a pixel electrode on the first base substrate which is provided with the organic insulating layer.

Referring to FIG. 4-10, a schematic structure diagram for forming a pixel electrode 017 on a first base substrate 010 with an organic insulating layer 011 provided by the embodiment in FIG. 4-3 is shown. Referring to FIG. 4-10, the pixel electrode 017 is in contact with the drain electrode 0162 through the via hole in the organic insulating layer 011, wherein the pixel electrode 017 can be made of a metal material.

For example, the methods of coating, magnetron sputtering, thermal evaporation or PECVD can be used to deposit a layer of metal material on the first base substrate 010 with the active layer 015 to form a metal film layer, then one patterning process is used to the metal film layer to obtain the pixel electrode 017. The process of using one patterning process with respect to the metal film to obtain the pixel electrode 017 is similar to the process of using one patterning process to form the source-drain electrode metal layer 016 in the sub-step 4014, which will not be described herein for simplicity in the embodiment of the present disclosure.

Sub-step 4018: forming an organic insulating buffer layer on the first base substrate with the pixel electrode, wherein a notch is formed in the area of the organic insulating buffer layer corresponding to the via hole.

A structure schematic diagram of the array substrate after forming an organic insulating buffer layer 012 on the first base substrate 017 with a pixel electrode 010 is shown in FIG. 4-2. Referring to FIG. 4-2, the notch B is formed at the corresponding area of the organic insulating buffer layer 012. In the embodiment of the present disclosure, the range of the depth of the notch B is from 1.0 µm to 1.9 µm. The organic insulating buffer layer 012 can be made of a resin material.

For example, the methods of coating, magnetron sputtering, thermal evaporation or PECVD can be used to deposit a layer of transparent resin material on the first base substrate 010 provided with the pixel electrode 017 to form the organic insulating buffer layer 012.

It should be understood that in practice, when the organic insulating buffer layer 012 includes a pattern, a patterning process can be used to obtain the pattern of the organic insulating buffer layer 012, and the forming method is not limited herein in the embodiment of the present disclosure.

Step 402: forming a color filter substrate. The color filter substrate includes a second base substrate, and a main spacer and a secondary spacer are formed on the second base substrate.

Referring to FIG. 4-11, a schematic structure diagram of a color filter substrate 02 provided by the embodiment in FIG. 4-1 is shown. Referring to FIG. 4-11, the color filter substrate 02 includes a second base substrate 020. The second base substrate 020 is provided with the main spacer 021 and the secondary spacer 022 thereon. The height of the main spacer 021 is equal to the height of the secondary spacer 022. Both a longitudinal section of the main spacer 021 and a longitudinal section of the secondary spacer 022 are in trapezoid shapes, and cross sections of the main spacer 021 and the secondary spacer 022 at a same height may be the same. The longitudinal sections of the main spacer 021 and the secondary spacer 022 are in planes perpendicular to the surface of the second base substrate, and the cross sections of the main spacer 021 and the secondary spacer 022 are in planes parallel to the surface of the second base substrate 020. For example, in the embodiment of the present disclosure, the structures of the main spacer 021 and the secondary spacer 022 are in truncated cone shapes, or the structures of the main spacer 021 and the secondary spacer 022 are in pyramidal shapes, and the structures thereof are not limited herein in the embodiment of the disclosure.

In the embodiments of the disclosure, the main spacer 021 and the secondary spacer 022 can be made of a photosensitive organic resin material. For example, the methods of coating, magnetron sputtering, thermal evaporation or PECVD can be used to deposit a layer of organic resin material on the second base substrate 010 to form an organic resin film, then a mask plate can be used to expose the organic resin film so that the organic resin film can form a fully exposed and a non-exposed area. After the development process is used, the fully exposed area of the organic resin film is completely removed and the non-exposed area of the organic resin film is completely retained, and the main spacer 021 and the secondary spacer 022 are formed in the non-exposed area.

It should be understood that in the embodiment of the disclosure, the common mask is used to expose the organic resin film to form the main spacer 021 and the secondary spacer 022, and it is not necessary to use a half tone mask, so the cost of forming the spacers is saved.

Step 403, cell-assembling the color filter substrate and the array substrate such that the orthogonal projection of the secondary spacer is located in the orthogonal projection area of the via hole on the first base substrate and the orthogonal projection of the main spacer is located outside of the orthogonal projection area of the via hole on the first base substrate.

A schematic structure diagram of the display device 0 where the color filter substrate 02 and the array substrate 01 are cell-assembled is shown in FIG. 2-2. Referring to FIG. 2-2, the orthogonal projection of the secondary spacer 022 is located in the orthogonal projection area of the notch B on the first base substrate 010; the orthogonal projection of the main spacer 021 is located outside of the orthogonal projection area of the notch B on the first base substrate 010, and this configuration can implement the mismatch between the main spacer 021 and the secondary spacer 022 via the notch B. When at least one of the array substrate 01 and the color filter substrate 02 is subjected to an external pressure, the main spacer 021 is subjected to all the pressure and compressed firstly; when the main spacer 021 is compressed to such a degree that the secondary spacer 022 is in contact with the bottom of the notch B, the main spacer 021 and the secondary spacer 022 will bear the external pressure together. For example, referring to FIG. 2-3, a schematic structure diagram of a display device under compression provided by the embodiment in FIG. 2-2 is shown. In FIG. 2-3, upon the display device being pressed, the main spacer 021 is compressed first, and then the secondary spacer is in contact with the bottom of the notch B. At this time, the main spacer 021 and the secondary spacer 022 will bear external pressure together. When the external pressure is removed, the display device 0 will restore to the state as shown in FIG. 2-2. In the embodiment of the disclosure, the mismatch between the main spacer 021 and the secondary spacer 022 can be finely tuned by the shape variable of the spacer.

The manufacturing method of the display device provided by the embodiment of the disclosure includes forming the array substrate and the color filter substrate; forming of the array substrate includes forming an organic insulating layer on the first base substrate, and forming the via hole in the organic insulating layer. Forming the color filter substrate includes forming the main spacer and the secondary spacer on the second base substrate, and cell-assembling the color filter substrate and the array substrate to allow that the orthogonal projection of the secondary spacer is located in the orthogonal projection area of the via hole on the first base substrate and that the orthogonal projection of the main spacer is located outside of the orthogonal projection area of the via hole on the first base substrate. Because the display device manufactured by the manufacturing method of the display device provided by the embodiment of the present disclosure uses the via hole on the array substrate to implement the mismatch between the main spacer and the secondary spacer, a common mask can be used to form the main spacer and the secondary spacer, saving the forming cost of the spacers. Thus, the problem of the high cost of using the half-tone mask to form the spacers is solved, and the effect of saving the cost of forming the spacers is achieved.

Usually, when a half-tone mask is used to form both main spacers and secondary spacers, due to the limitation on the manufacturing process of the half-tone mask, the consistency of the exposure amount in each area of the half tone mask is difficult to control, which causes the consistency among the main spacers to be lower, the consistency among the secondary spacers to be lower as well, and the stability for manufacturing the spacers to be lower. However, in the embodiment of the disclosure, a common mask can be used to form the main spacers and the secondary spacers. As the photometric exposure in each area of the common mask is substantially the same, the consistency among the formed main spacers and secondary spacers becomes higher, and the stability for manufacturing the spacer becomes higher.

Usually, the manufacturing of main spacers and secondary spacers can be implemented by designing different apertures on the spacer mask. For example, the spacer mask includes two kinds of the openings with two different apertures, the openings having the bigger apertures are corresponding to the main spacers, and the openings having the smaller apertures are corresponding to the secondary spacers. The spacer mask can be used to implement the manufacture of the main spacers and the secondary spacers, but the range of the mismatch between the main spacers and the secondary spacers manufactured by using the spacer mask is generally from 0.2 µm to 0.4 µm. Therefore, the mismatch between the main spacer and the secondary spacer manufactured by using the spacer mask is smaller too, which causes the display device to have a lower tolerance for liquid crystal fluctuation and the yield of the display device to be lower. The display device may be suitable to some low-end products; but for high-end products, especially touch screen products, thus obtained display devices cannot meet the application requirements. In contrast, in the display device provided by the embodiment of the disclosure, the range of the depth of the notch is from 1.0 μm to 1.9 μm, thus the range of the mismatch between the main spacers and the secondary spacers, which is produced due to the notch, is generally from 1.0 μm to 1.9 μm, the mismatch between the main spacer and the secondary spacer is bigger, the tolerance of the display device to the liquid crystal fluctuation is higher, and the yield of the display device is improved. Therefore, the display device can be applied to high-end products.

A common mask can be used to form the main spacer and the secondary spacer in the display device provided by the embodiment of the disclosure, the LC margin in display device is improved, and especially in the touch screen area, the stability of the touch screen display is improved, while the process flow and the cost of the display device provided by the embodiment of the disclosure is not increased during the manufacturing process.

It should be understood that the manufacturing method of the display device provided by the embodiment of the disclosure can be applied to the product of liquid crystal display devices of modes such as Advanced Super Dimension Switch (ADS), In-Plane Switching (I spacer), Twist Nematic (TN) and so on. The ADS technology can use multi-dimensional electric fields which are produced with parallel electric fields which are generated by the edges of the pixel electrodes in a same plane and vertical electric fields which are generated between the pixel electrode layer and the common electrode layer, and the liquid crystal molecules among the pixel electrodes in the liquid crystal cell or on the top of the electrodes are capable of be rotated and switched, thus the working efficiency of plane orientation liquid crystal is improved and the light transmission efficiency is increased.

The term "and/or" in the present disclosure is only used to describe the relationship between the related objects, and there are three kinds of relationships. For example, A and/or B can means three cases: A alone, A and B, and B alone. Furthermore, in this disclosure, the character "/" generally indicates the alternative relationship between objects that is, a "or" relationship.

Those skilled in this field can understand that all or part of the steps of the above embodiments can be implemented by hardware, or can be implemented by using a program to instruct a hardware to run, the program can be stored in a computer readable storage medium, and the above mentioned storage medium can be a read-only memory, a disk or an optical disk.

What are described above is related to the illustrative embodiments of the disclosure only and not limitative to the scope of the disclosure; the scopes of the disclosure are defined by the accompanying claims.

The present application claims the priority of the Chinese Patent Application No. 201610055690.X filed on Jan. 27, 2016, which is entirely incorporated herein by reference as part of the disclosure of the present application.

What is claimed is:

1. A display device, comprising: an array substrate and a color filter substrate which are cell-assembled together, wherein the array substrate comprises a first base substrate, and a driving device, a gate line is formed on the first base substrate, and the driving device is electrically connected with the gate line; and an organic insulating layer is formed on the first base substrate which is provided with the gate line, and a via hole is formed in the organic insulating layer; an organic insulating buffer layer is formed on the first base substrate which is provided with the organic insulating layer, a notch is formed at a region of the organic insulating buffer layer corresponding to the via hole, and the organic insulating buffer layer contacts the gate line through the via hole; an orthogonal projection of the driving device on the first base substrate is located in an orthogonal projection area of the gate line on the first base substrate; and the color filter substrate comprises a second base substrate, and a main spacer and a secondary spacer are formed on the second base substrate;

an orthogonal projection of the secondary spacer on the first base substrate is located in an orthogonal projection area of the via hole on the first base substrate;

an orthogonal projection of the main spacer on the first base substrate is located outside of the orthogonal projection area of the via hole on the first base substrate, the orthogonal projection of the main spacer on the first base substrate and the orthogonal projection of the secondary spacer on the first base substrate are located in an orthogonal projection area of the gate line on the first base substrate, and cross sections of the main spacer and the secondary spacer at a same height are same.

2. The display device according to claim 1, wherein a height of the main spacer is equal to a height of the secondary spacer.

3. The display device according to claim 2, wherein both a longitudinal section of the main spacer and a longitudinal section of the secondary spacer are in trapezoid shapes.

4. The display device according to claim 3, wherein structures of the main spacer and the secondary spacer are in truncated cone shapes or in pyramidal shapes.

5. The display device according to claim 1, wherein a range of a depth of the notch is from 1.0 μm to 1.9 μm.

6. A manufacturing method of a display device, comprising:

forming an array substrate, wherein forming of the array substrate comprises: forming a gate line on a first base substrate; forming a driving device on the first base substrate which is provided with the gate line, the driving device being electrically connected with the gate line; forming the organic insulating layer on the first base substrate which is provided with the driving device; forming a via hole in the organic insulating layer; forming an organic insulating buffer layer on the first base substrate which is provided with the organic insulating layer, and forming a notch at a region of the organic insulating buffer layer corresponding to the via hole, wherein the organic insulating buffer layer contacts the gate line through the via hole;

forming a color filter substrate, wherein forming of the color filter substrate comprises: forming a main spacer and a secondary spacer on a second base substrate;

cell-assembling the color filter substrate and the array substrate such that an orthogonal projection of the secondary spacer on the first base substrate is located in an orthogonal projection area of the via hole on the first base substrate and an orthogonal projection of the main spacer on the first base substrate is located outside of the orthogonal projection area of the via hole on the first base substrate;

wherein an orthogonal projection of the driving device on the first base substrate is located in an orthogonal projection area of the gate line on the first base substrate, the orthogonal projection of the main spacer on the first base substrate and the orthogonal projection of the secondary spacer on the first base substrate are located in an orthogonal projection area of the gate line on the first base substrate, and cross sections of the main spacer and the secondary spacer at a same height are identical.

7. The manufacturing method according to claim 6, wherein a height of the main spacer is equal to a height of the secondary spacer.

8. The manufacturing method according to claim 7, wherein both a longitudinal section of the main spacer and a longitudinal section of the secondary spacer are in trapezoid shapes.

9. The manufacturing method according to claim 8, wherein structures of the main spacer and the secondary spacer are in truncated cone shapes or in pyramidal shapes.

10. The manufacturing method according to claim 6, wherein a range of a depth of the notch is from 1.0 μm to 1.9 μm.

* * * * *